United States Patent
Satake et al.

(10) Patent No.: US 7,784,017 B2
(45) Date of Patent: Aug. 24, 2010

(54) LITHOGRAPHY SIMULATION METHOD, PHOTOMASK MANUFACTURING METHOD, SEMICONDUCTOR DEVICE MANUFACTURING METHOD, AND RECORDING MEDIUM

(75) Inventors: Masaki Satake, Yokohama (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 11/783,935

(22) Filed: Apr. 13, 2007

(65) Prior Publication Data
US 2007/0245292 A1    Oct. 18, 2007

(30) Foreign Application Priority Data
Apr. 17, 2006    (JP)    ............... 2006-113692

(51) Int. Cl.
*G06F 17/50*    (2006.01)
(52) U.S. Cl. .................. 716/19; 716/20; 716/21; 430/5; 430/30
(58) Field of Classification Search .......... 716/19–21; 430/5, 30
See application file for complete search history.

(56) References Cited
U.S. PATENT DOCUMENTS

| | | | | |
|---|---|---|---|---|
| 5,627,626 A | * | 5/1997 | Inoue et al. ................ | 355/67 |
| 6,954,549 B2 | * | 10/2005 | Kraft .......................... | 382/167 |
| 7,207,030 B2 | * | 4/2007 | Kuchler et al. ............... | 716/21 |
| 2003/0200523 A1 | * | 10/2003 | Takahashi et al. ............ | 716/19 |
| 2005/0076321 A1 | * | 4/2005 | Smith ......................... | 716/19 |

OTHER PUBLICATIONS

Bai, et al., "Approximation of Three Dimensional Mask Effects with Two Dimensional Features", Proc. of SPIE, vol. 5751, pp. 446-454, (2005).
Adam, "Modeling of Electromagnetic Effects from Mask Topography at Full-Chip Scale", Proc. of SPIE, vol. 5754, pp. 498-505, (2005).
Satake, et al., "Assessment of Wafer Pattern Prediction Accuracy by Introducing Effectively Equivalent Mask Patterns", Proc. of SPIE, vol. 6283, pp. 62831B-1-62831B-8, (2006).
Erdmann, et al., "Mask and Wafer Topography Effects in Immersion Lithography", Proceedings of SPIE, vol. 5754, pp. 383-394, (Mar. 2005).

* cited by examiner

*Primary Examiner*—Nghia M Doan
(74) *Attorney, Agent, or Firm*—Finnegan, Henderson, Farabow, Garrett & Dunner, L.L.P.

(57) ABSTRACT

A lithography simulation method includes obtaining a mask transmission function from a mask layout, obtaining an optical image of the mask layout by using the mask transmission function, obtaining a function which is filtered by applying a predetermined function filter to the mask transmission function, and correcting the optical image by using the filtered function.

13 Claims, 6 Drawing Sheets

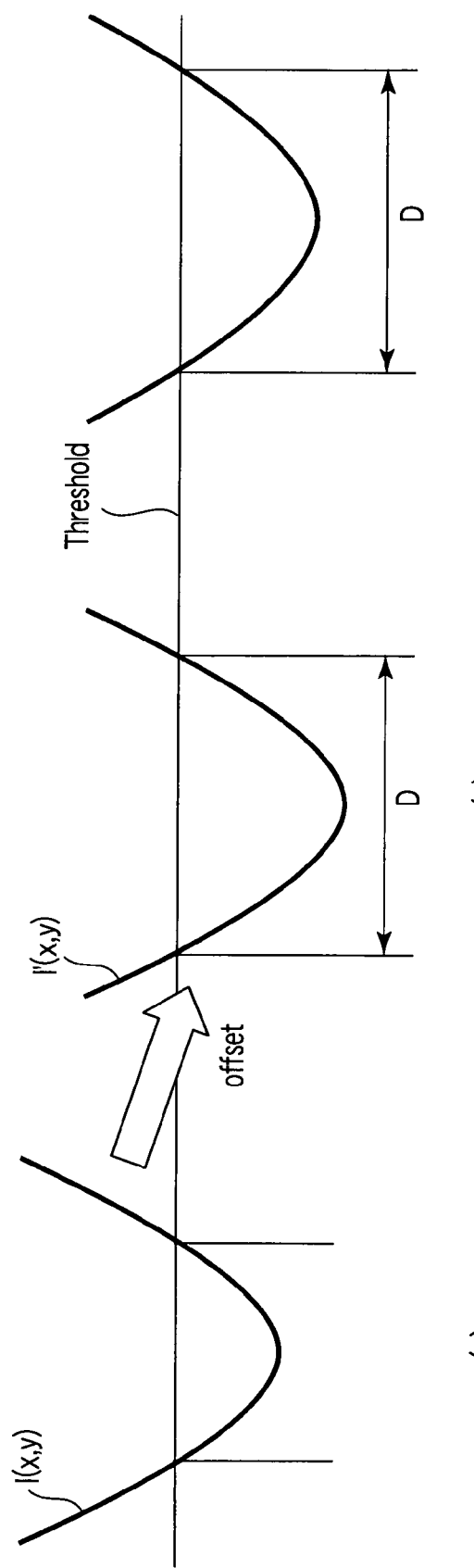
F I G. 5

LITHOGRAPHY SIMULATION METHOD, PHOTOMASK MANUFACTURING METHOD, SEMICONDUCTOR DEVICE MANUFACTURING METHOD, AND RECORDING MEDIUM

CROSS-REFERENCE TO RELATED APPLICATIONS

This application is based upon and claims the benefit of priority from prior Japanese Patent Application No. 2006-113692, filed Apr. 17, 2006, the entire contents of which are incorporated herein by reference.

BACKGROUND OF THE INVENTION

1. Field of the Invention

The present invention relates to a lithography simulation method and the like.

2. Description of the Related Art

With the miniaturization of mask patterns (mask layouts), it becomes more difficult to secure the accuracy of lithography simulation.

For example, there is a large difference between a simulation result obtained by a mask thin film approximation model and a simulation result obtained by accurate calculation based on a mask topography effect (for example, see "Proc. SPIE2005, vol. 5754, p. 383-394, March 2005"). Therefore, in order to perform a highly accurate simulation, an accurate calculation should be carried out based on the mask topography effect. That is to say, an accurate calculation should be carried out based on an electromagnetic field near a mask. However, when an accurate calculation is tried to be carried out based on the mask topography effect, the calculation amount becomes enormous. It is, therefore, difficult to perform the highly accurate lithography simulation using a simple method based on the mask topography effect.

With the miniaturization of the mask patterns (mask layouts), lithography simulation based on mask production dispersion becomes important. It is, however, difficult to perform the highly accurate lithography simulation using a simple method based on the mask production dispersion.

Conventionally, it is difficult to perform the highly accurate lithography simulation using a simple method.

BRIEF SUMMARY OF THE INVENTION

A lithography simulation method according to a first aspect of the present invention comprises: obtaining a mask transmission function from a mask layout; obtaining an optical image of the mask layout by using the mask transmission function; obtaining a function which is filtered by applying a predetermined function filter to the mask transmission function; and correcting the optical image by using the filtered function.

A computer-readable medium according to a second aspect of the present invention is configured to store program instructions for execution on a computer, the program instructions causing the computer to perform: obtaining a mask transmission function from a mask layout; obtaining an optical image of the mask layout by using the mask transmission function; obtaining a function which is filtered by applying a predetermined function filter to the mask transmission function; and correcting the optical image by using the filtered function.

BRIEF DESCRIPTION OF THE SEVERAL VIEWS OF THE DRAWING

FIG. 5 is a diagram illustrating an optical image and an offset value according to the embodiment of the present invention;

DETAILED DESCRIPTION OF THE INVENTION

Embodiments of the present invention will be described below with reference to the drawings.

First Embodiment

Figure 1:
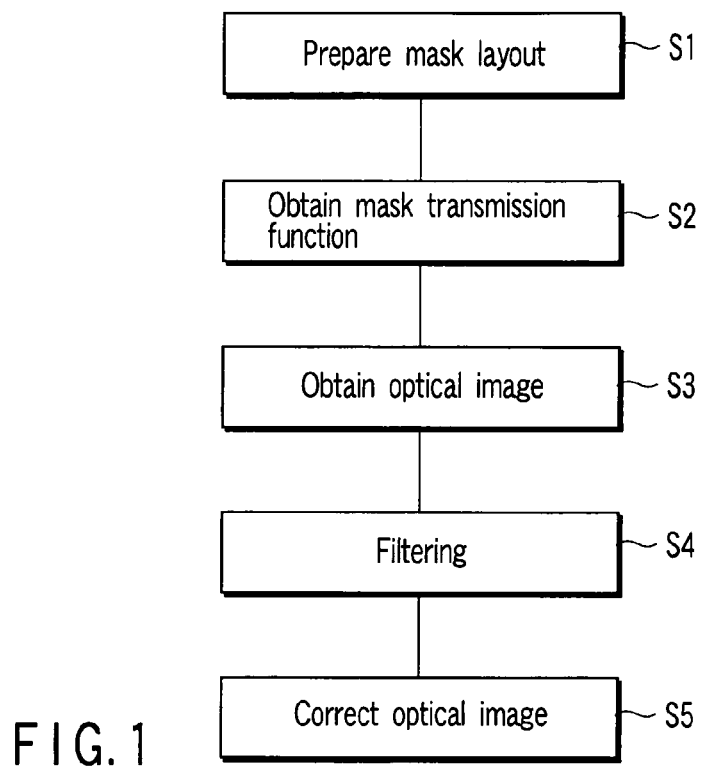
FIG. 1 is a flowchart illustrating a basic procedure of a lithography simulation method according to an embodiment of the present invention.
Figure 2:
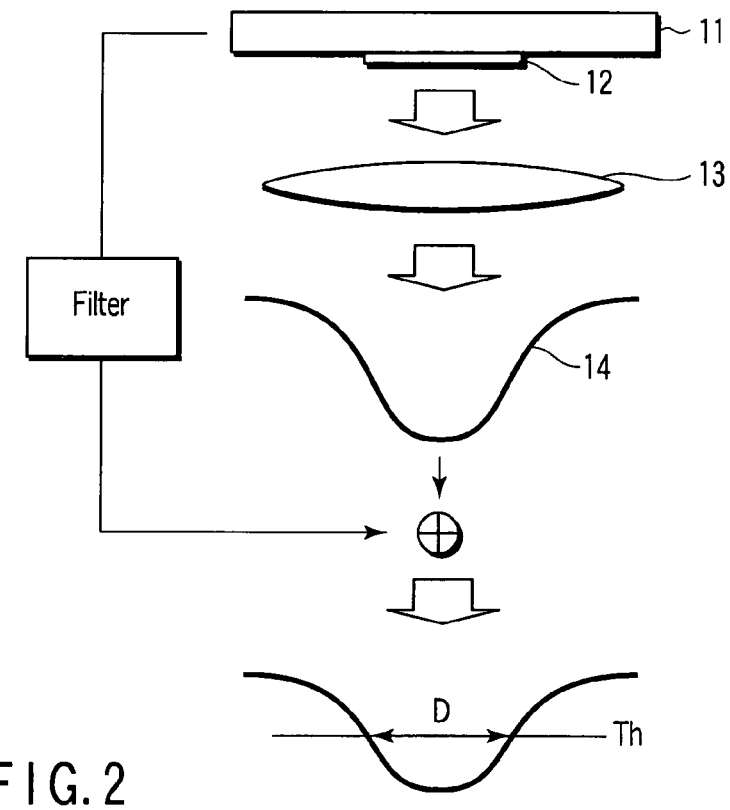
FIG. 2 is an explanatory diagram illustrating a basic concept of the lithography simulation method according to the embodiment of the present invention.
Figure 3:
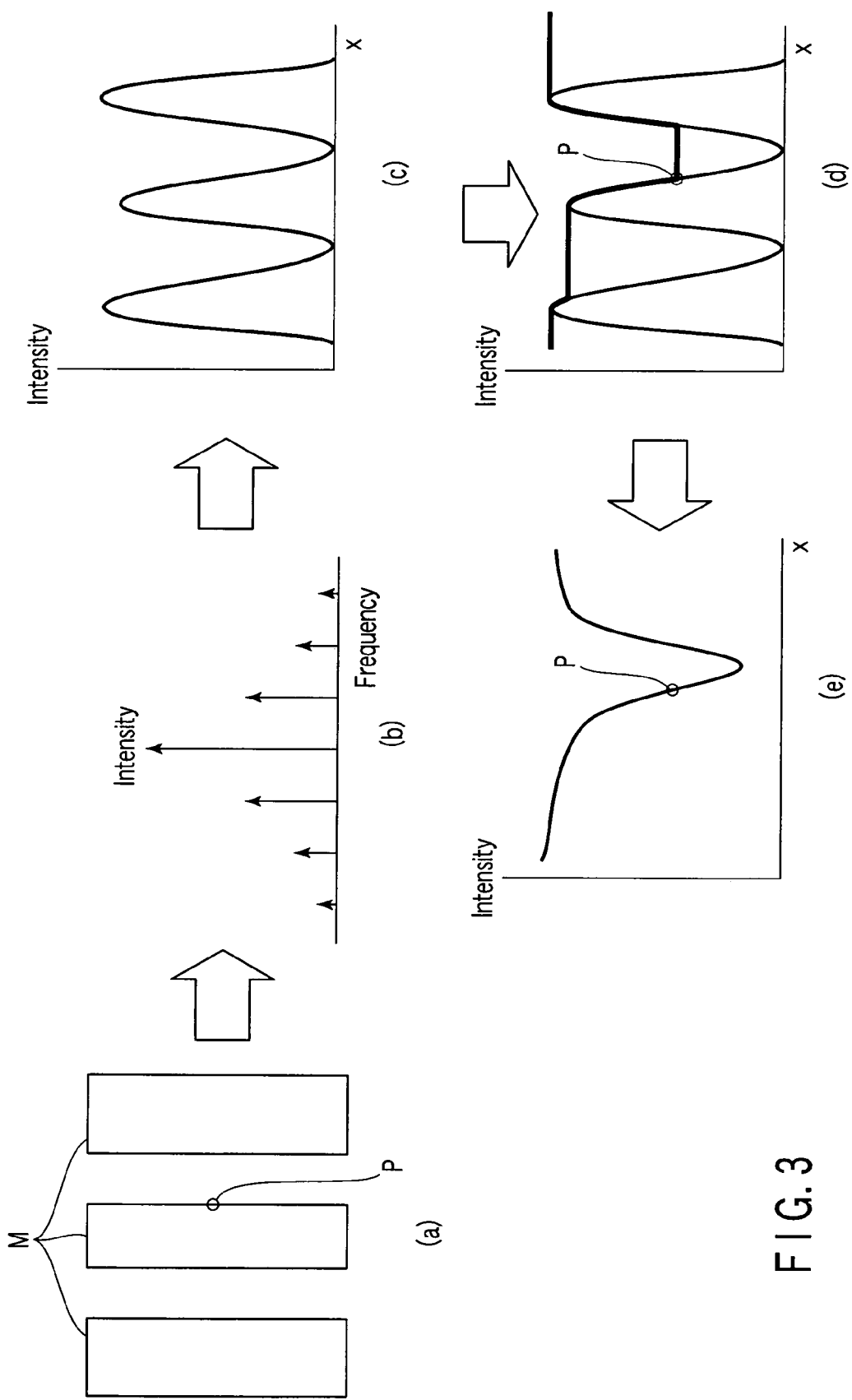
FIG. 3 is a diagram illustrating a part of the lithography simulation method according to the embodiment of the present invention in detail.

FIG. 1 is a flowchart illustrating a basic procedure of a lithography simulation method according to a first embodiment of the present invention. FIG. 2 is an explanatory diagram illustrating a basic concept of the lithography simulation method according to the first embodiment of the present invention. FIG. 3 is a diagram illustrating a part of the lithography simulation method according to the first embodiment of the present invention in detail. The lithography simulation method according to the first embodiment will be described below with reference to these drawings.

Data of a mask layout (mask pattern) which is subject to the lithography simulation is prepared (S1). The data of a mask layout M shown in FIG. 3(a) is prepared. A point P in FIG. 3(a) shows a point at which optical image intensity is desired to be obtained by the simulation.

A mask transmission function is obtained from the mask layout (S2). That is to say, a light transmission property of the mask layout M is obtained. In the first embodiment, the mask data of the mask layout M is subject to a Fourier transform process (see FIG. 3(b)), and is further subject to an inverse Fourier transform process (see FIG. 3(c)). That is to say, FIG. 3(b) illustrates a mask transmission function in a frequency domain, and FIG. 3(c) illustrates a mask transmission function in a space domain.

An optical image of the mask layout M is obtained by using the mask transmission function (S3). That is to say, as shown in FIG. 2, an image of a mask pattern (mask layout) 12 on a photomask 11 which has passed through an optical system 13 is obtained as an optical image 14. The optical image 14 is defined by intensity distribution of the light passed through the optical system 13.

The optical image 14 is calculated by using a mask thin film approximation model. In the mask thin film approximation model, a thickness of the pattern on the photomask is assumed to be zero, and the mask topography effect is not taken into consideration. For example, the optical image 14 is calculated by using a partial coherent imaging equation expressed by the following formula (1):

An optical image obtained by the accurate calculation of the electromagnetic field based on a physical model in which the mask topography effect is considered and an optical image obtained without taking the mask topography effect into consideration are obtained with respect to a plurality of typical patterns. A difference between both the optical images (offset value) is calculated. As a result, the coefficients a and $$I(x,y) = \int\int\int S(f,g)P(f+f_1,g+g_1)P^*(f+f_2,g+g_2)\hat{m}(f_1,g_1)\hat{m}^*(f_2,g_2)\cdot\exp(-2\pi i((f_1-f_2)x+(g_1-g_2)y))df_1dg_1df_2dg_{21}dfdg = \int S(f,g)\left|\int P(f+f_1,g+g_1)\hat{m}(f_1,g_1)\exp(-2\pi i(f_1x+g_1y))df_1dg_1\right|^2 dfdg \quad (1)$$

where I(x,y) designates the light intensity distribution (optical image) at a point (x,y), S designates intensity distribution of an effective light source, P designates a pupil function of a projection optical system, * designates a complex conjugate, and m^ designates Fourier transform of complex transmittance distribution of the mask pattern.

A filtered function is obtained by applying a predetermined function filter to the mask transmission function (S4). That is to say, the function is obtained by multiplying the mask transmission function by the predetermined function filter. In the first embodiment, the filtering process is executed by using an upper peak hold (UPH) filter.

Figure 4:
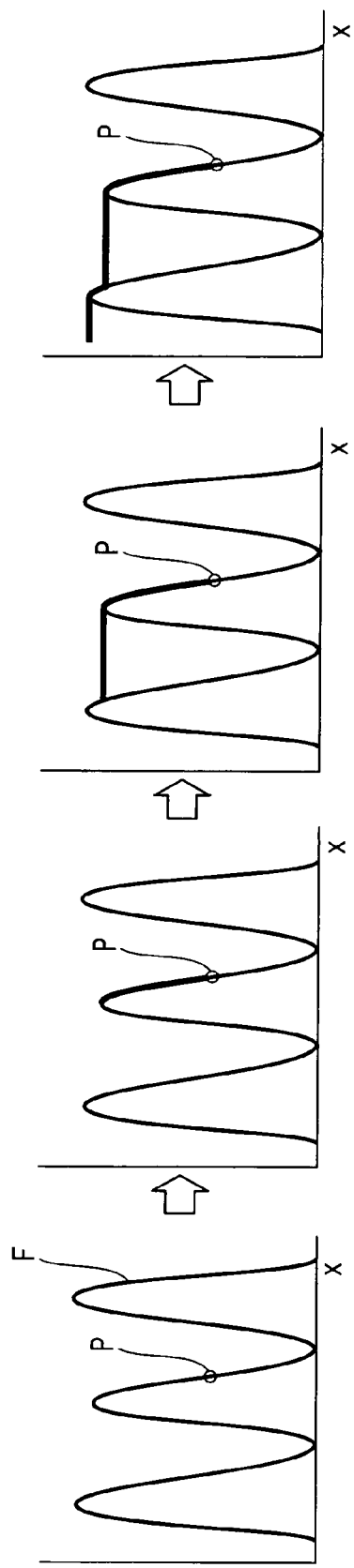
FIG. 4 is a diagram schematically illustrating a function of a UPH filter according to the embodiment of the present invention.

FIG. 4 is a diagram schematically illustrating the operation of the UPH filter. A mask transmission function curve is traced in left and right directions starting from the point P (the point at which the optical image intensity is desired to be obtained) on the mask transmission function F (FIG. 4 illustrates a state of tracing to the left direction). When a value of a vertical axis is larger than a previous maximum value, the value on the mask transmission function curve becomes a filter value. When the value of the vertical axis is smaller than the previous maximum value, the previous maximum value is maintained as a filter value. That is to say, the UPH filter maintains a higher intensity value.

As shown in FIG. 3(d), a function UPH(LPF(M), x, y) which is subject to the UPH filter process is obtained. In the first embodiment, the function UPH(LPF(M), x, y) is further subject to convolution of a Gauss function G(σ). As a result, a function G(σ) @UPH(LPF(M), x, y) shown in FIG. 3(e) is obtained. "@" is a symbol of convolution integration. Here, following equations are given.

$$SSI = G(\sigma)@UPH(LPF(M),x,y) \quad (2)$$

SSI designates a Space Sensitive Intensity, $$\text{offset} = a \times SSI + b \quad (3)$$

where "a" and "b" are coefficients (constants) which are obtained in advance.

Figure 6:
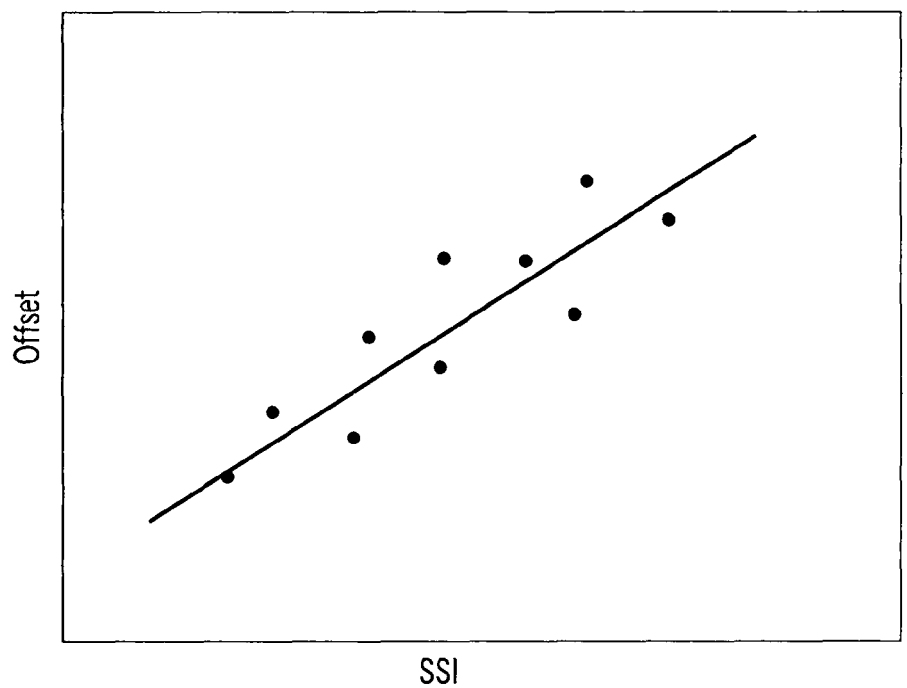
FIG. 6 is a diagram illustrating a correlation between an SSI value and an offset value according to the embodiment of the present invention.

The offset value will be described with reference to FIG. 5. FIG. 5(a) illustrates the optical image (light intensity distribution) I(x,y) obtained using the mask thin film approximation model without taking the mask topography effect into consideration. FIG. 5(c) illustrates the optical image (light intensity distribution) obtained by accurate calculation of an electromagnetic field based on the mask topography effect. FIG. 5(b) illustrates the optical image I'(x,y) obtained by adding the offset value to the optical image I(x,y) of FIG. 5(a). The offset value is determined so that a dimension D obtained by slicing the optical image using a constant threshold in FIG. 5(b) is equal to that in FIG. 5(c).

b in the formula (3) can be obtained in advance. That is to say, parameters of the function filter (corresponding to the coefficients a and b) can be fitted to reflect the mask topography effect in advance. For example, as shown in FIG. 6, with respect to the plural typical patterns, the offset value and the SSI value are plotted. The coefficients a and b are obtained so that a line (straight line in FIG. 6) showing the correlation between the offset value and the SSI value is expressed in the formula (3).

In this embodiment, as shown in the formula (3), "offset" is expressed in a linear formula of "SSI", but generally, $$\text{offset} = C_0 + C_1 \times SSI + C_2 \times SSI^2 + C_3 \times SSI^3 + \ldots \quad (4)$$

In such a manner, "offset" is expressed in a polynomial of "SSI".

The optical image is corrected by using the filtered function (SSI expressed in the formula (2)) (S5). Specifically, the offset value expressed in the formula (3) (in general, the formula (4)) is added to the optical image I(x,y) obtained without taking the mask topography effect into consideration. Therefore, the corrected optical image I'(x,y) is expressed as:

$$I'(x,y) = I(x,y) + \text{offset} \quad (5)$$

That is to say, as shown in FIG. 5, the offset value is added to the optical image I(x,y) obtained without taking the mask topography effect into consideration, so that the optical image I'(x,y), which approximates the optical image obtained by the accurate calculation of the electromagnetic field based on the mask topography effect, can be obtained.

In order to examine the effect of the simulation method in the first embodiment, seventeen kinds of patterns are simulated by using the method in the first embodiment and the conventional method. Specifically, a dimension D0 of the optical image obtained by the accurate calculation of the electromagnetic field based on the mask topography effect, a dimension D1 of the optical image obtained by the method in the first embodiment, and a dimension D2 of the optical image obtained by the conventional method are calculated. A dimensional difference between D1 and D0 is 1.0 nm in RMS (root mean square), and a dimensional difference between D2 and D0 is 4.1 nm in RMS. Therefore, an error with respect to the optical image obtained by the accurate calculation of the electromagnetic field based on the mask topography effect can be reduced greatly by using the simulation method in the first embodiment.

According to the first embodiment, even if the electromagnetic field is not accurately calculated based on the mask topography effect, the lithography simulation equivalent to the simulation based on the mask topography effect can be done. The highly accurate lithography simulation can be, therefore, realized by a simple method.

In the first embodiment, the mask data of the mask layout M shown in FIG. 3(a) is subject to the Fourier transform process (see FIG. 3(b)), and is further subject to the inverse Fourier transform process (see FIG. 3(c)). In other words, the mask data is subject to a LPF (low-pass filter) process. However, such an LPF process does not always have to be executed. For example, the mask transmission function may be obtained directly from the mask data of the mask layout M without executing the LPF process. The mask transmission function obtained directly in such a manner may be subject to the filtering process using the upper peak hold (UPH) filter.

Second Embodiment

In the first embodiment, the filtering process is executed by using the upper peak hold (UPH) filter, but in a second embodiment, the filtering process is executed by using a Gauss function filter. Since the basic method is similar to that in the first embodiment, the description about the parts described in the first embodiment is omitted.

When the filtering process is executed by using the Gauss function filter, it is expressed as:

$$M'(x,y,\sigma)=M(x,y)@G(\sigma) \quad (6)$$

where M(x,y) designates the mask transmission function, G(σ) designates the Gauss function filter whose standard deviation is σ, and M'(x,y,σ) designates the filtered function.

In this case, the optical image I'(x,y) is expressed as:

$$I'(x,y)=I(x,y)+a\times M'(x,y,\sigma) \quad (7)$$

With respect to the plural typical patterns, fitting is carried out so that the dimension of the optical image I'(x,y) approaches the dimension of the optical image obtained by the accurate calculation of the electromagnetic field based on the mask topography effect. As a result, the values a and c can be obtained in advance.

In order to examine the effect of the simulation method in the second embodiment, seventeen kinds of patterns are simulated by using the method in the second embodiment and the conventional method. Specifically, a dimension D0 of the optical image obtained by the accurate calculation of the electromagnetic field based on the mask topography effect, a dimension D1 of the optical image obtained by the method in the second embodiment, and a dimension D2 of the optical image obtained by the conventional method are calculated. A dimensional difference between D1 and D0 is 0.91 nm in RMS (root means square), and a dimensional difference between D2 and D0 is 4.1 nm in RMS. As to the simulation conditions, NA is 0.915, a coherence factor σ is 0.95. When the simulation method in the second embodiment is used, an error with respect to the optical image obtained by the accurate calculation of the electromagnetic field based on the mask topography effect can be reduced greatly.

Similarly to the first embodiment, in the second embodiment, the lithography simulation equivalent to the simulation based on the mask topography effect can be done without the accurate calculation of the electromagnetic field based on the mask topography effect. Therefore, the highly accurate lithography simulation can be realized by a simple method.

Third Embodiment

A third embodiment relates to lithography simulation in which mask production dispersion is considered. Since the basic method is similar to that in the first embodiment, the description about the parts described in the first embodiment is omitted.

Figure 7:
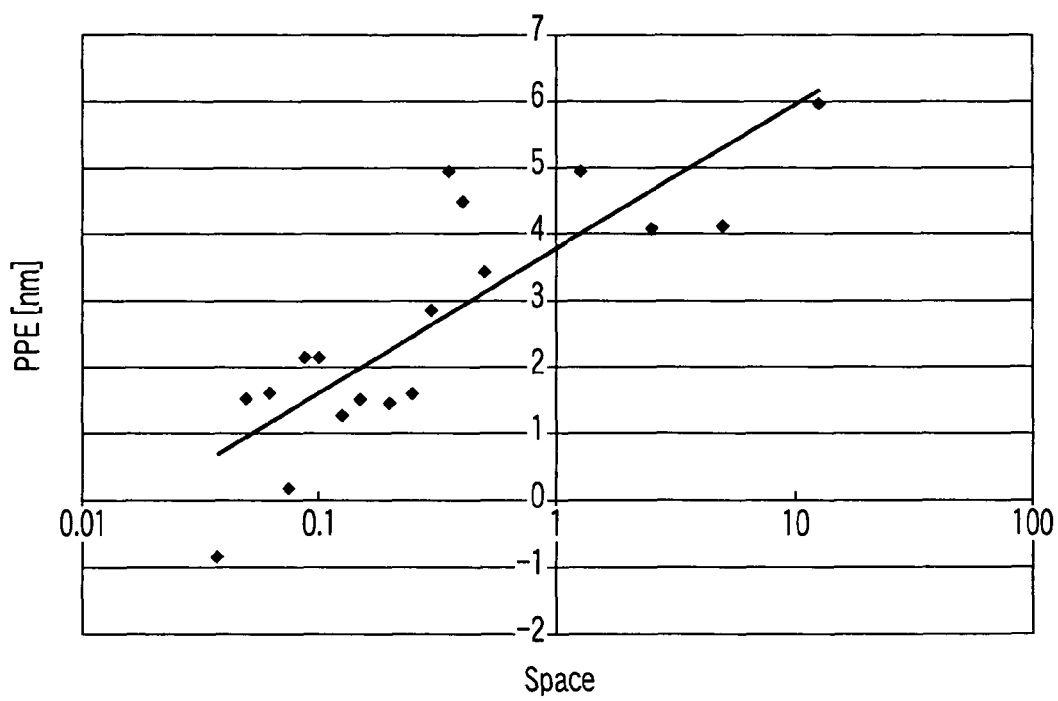
FIG. 7 is a diagram illustrating a correlation between a space value and a PPE value according to the embodiment of the present invention.

FIG. 7 is a diagram illustrating a relationship between a space width and the production dispersion of the mask pattern. The vertical axis shows a shift amount (error amount) of the pattern based on a process proximity effect (PPE). As shown in FIG. 7, the shift amount of the pattern varies according to the space width.

Conventionally, it is necessary to resize all the patterns according to the space width (the dimension of the patterns is changed) and perform the lithography simulation on the resized patterns. For this reason, the calculation amount becomes enormous, and thus it is difficult to perform the highly accurate lithography simulation based on the mask production dispersion according to a simple method. The highly accurate lithography simulation can be realized by a simple method as described below using the method in the third embodiment.

In the third embodiment, the filtering process is executed by using a Gauss function filter. In this case, it is expressed as:

$$M'(x,y,\sigma)=M(x,y)@G(\sigma) \quad (8)$$

where M(x,y) designates the mask transmission function, G(σ) designates the Gauss function filter whose standard deviation is σ, and M'(x,y,σ) designates the filtered function.

In this case, the optical image I'(x,y) is expressed as:

$$I'(x,y)=I(x,y)+a\times M'(x,y,\sigma) \quad (9)$$

With respect to a plurality of typical patterns, fitting is carried out so that the dimension of the optical image I'(x,y) approaches the dimension of the optical image obtained by the calculation using the resized patterns based on the mask production dispersion. As a result, the values "a" and "σ" can be obtained in advance. That is to say, the parameters of the function filter (corresponding to the coefficients "a" and "σ") can be fitted to reflect the mask production dispersion in advance.

In order to examine the effect of the simulation method in the third embodiment, twenty kinds of patterns are simulated by using the method in the third embodiment and the conventional method. Specifically, a dimension D0 of the optical image obtained by the accurate calculation using the resized patterns based on the mask production dispersion, a dimension D1 of the optical image obtained by the method in the third embodiment, and a dimension D2 of the optical image obtained by the conventional method are calculated. A dimensional difference between D1 and D0 is 0.5 nm in RMS (root mean square), and a dimensional difference between D2 and D0 is 2.0 nm in RMS. Therefore, the error with respect to the optical image obtained by the accurate calculation can be reduced by using the simulation method in the third embodiment.

In the third embodiment, even if the accurate calculation using the resized pattern is not carried out based on the mask production dispersion, the sufficiently highly accurate lithography simulation can be done. Therefore, the highly accurate lithography simulation can be done by a simple method.

In the first to third embodiments, the polynomial (for example, the polynomial expressed by the formula (4)) of the filtered function (for example, SSI expressed by the formula (2)) is added to the optical image I(x,y) so that the final optical image I'(x,y) is obtained. This is expressed by the following general formula:

$$I'(x,y)=I(x,y)+\Sigma C_i F_i(M) \quad (10)$$

where the filtered function is designated by F(M), and the polynomial of the filtered function is designated by $\Sigma C_i F_i(M)$ ($C_i$ is a coefficient of the polynomial).

Instead of the formula (10), the final optical image I'(x,y) may be obtained by using the following formula (11):

$$I'(x,y)=I(x,y)+\Sigma d_j G_j(M) \times I(x,y) \quad (11)$$

where G(M) designates the filtered function, $\Sigma d_j G_j(M) \times I(x,y)$ designates a polynomial of the function where the filtered function is multiplied by the optical image, and $d_j$ designates a coefficient of the polynomial.

The formula (10) may be combined with the formula (11). In this case, it is expressed as:

$$I'(x,y)=I(x,y)+\Sigma C_i F_i(M)+\Sigma d_j G_j(M) \times I(x,y) \quad (12)$$

When a calculation is carried out based on the formula (11) or (12), the effect similar to the above-described effect can be obtained.

Figure 8:
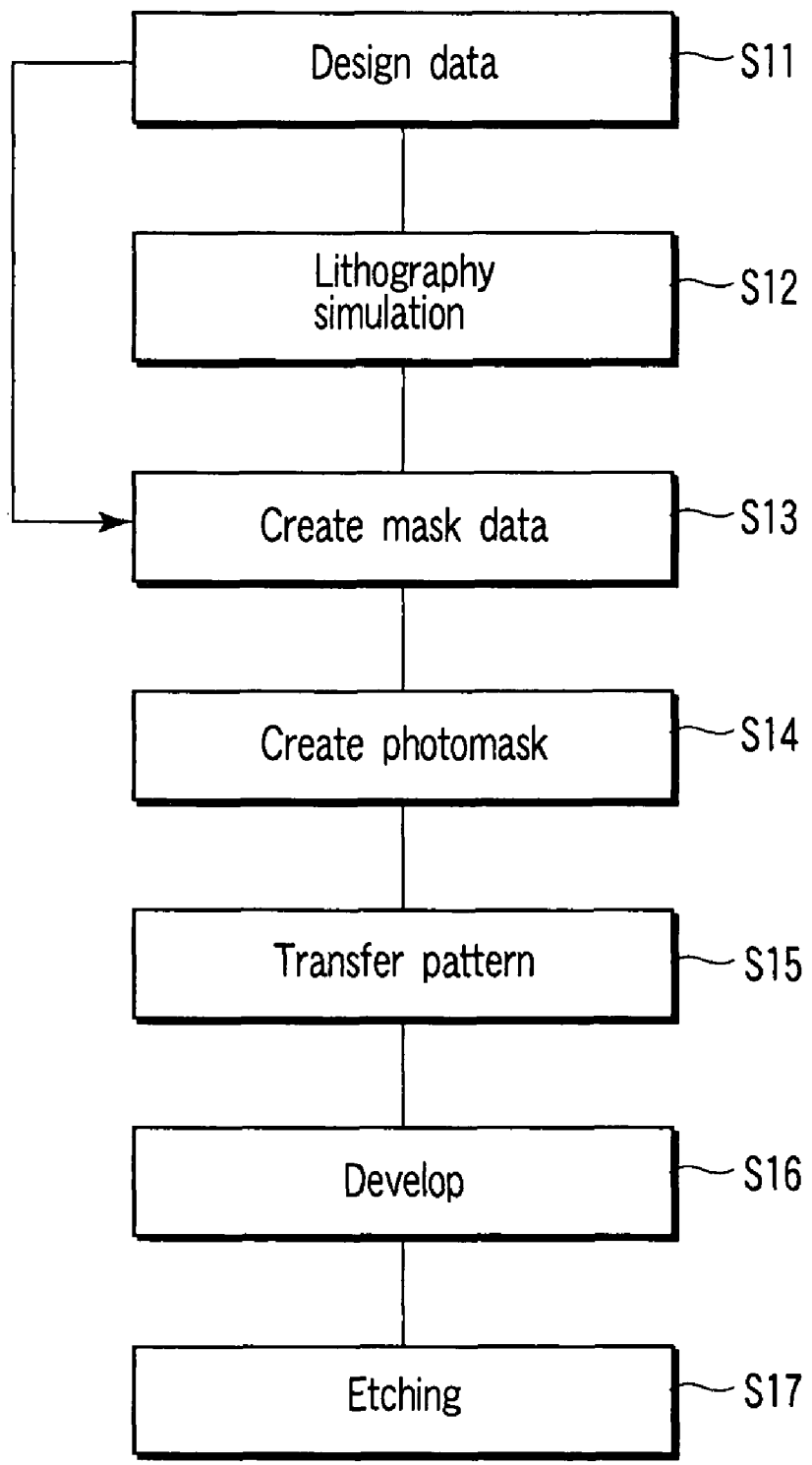
FIG. 8 is a flowchart illustrating an outline of a semiconductor device manufacturing method according to the embodiment of the present invention.

The lithography simulation methods described in the first to third embodiments can be applied to the method of manufacturing a semiconductor device. FIG. 8 is a flowchart illustrating the semiconductor device manufacturing method.

Design data are prepared (S11), and the lithography simulation is done according to the methods described in the first to third embodiments (S12). Mask data are created from the design data based on the guideline obtained by the lithography simulation (S13). A photomask is manufactured based on the created mask data (S14). The pattern formed on the photomask formed in such a manner is transferred (projected) to a photoresist on a semiconductor wafer (S15). The photoresist is developed so that a photoresist pattern is formed (S16). Etching is carried out by using the photoresist pattern as a mask, so that the pattern is formed on the semiconductor wafer (S17).

The methods described in the first to third embodiments can be realized by a computer where an operation is controlled by a program in which the procedure of the method is described. The program can be provided by a recording medium such as a magnetic disc or a communication line (wired line or wireless line) such as the Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lithography simulation method for a semiconductor device, comprising:
    generating data of a mask transmission function from a mask layout, the mask transmission function representing a light transmission property of the mask layout;
    creating an optical image of the mask layout, which has passed through an optical system, by using the data of the mask transmission function, wherein the optical image is an intensity distribution from the optical system;
    generating data of a filtered function which is obtained by performing an operation for data of a predetermined function filter and the data of the mask transmission function, wherein performing an operation for data of a predetermined function filter and the data of the mask transmission function includes multiplying the mask transmission function by the predetermined function filter; and
    correcting the optical image by using the data of the filtered function.

2. The method according to claim 1, wherein correcting the optical image by using the filtered function includes adding a value based on the filtered function to the optical image.

3. The method according to claim 1, wherein correcting the optical image by using the filtered function includes:
    obtaining a function where the optical image is multiplied by the filtered function; and
    adding a value based on the function obtained by the multiplication to the optical image.

4. The method according to claim 1, wherein correcting the optical image by using the filtered function includes correcting the optical image by using a polynomial of the filtered function.

5. The method according to claim 1, wherein correcting the optical image by using the filtered function includes correcting the optical image by using a polynomial of a function where the optical image is multiplied by the filtered function.

6. The method according to claim 1, wherein the optical image of the mask layout is obtained by using a mask thin film approximation model, in which a thickness of a pattern of the mask layout on a photomask is assumed to be zero.

7. The method according to claim 1, wherein a parameter of the predetermined function filter is fitted in advance so as to reflect a mask topography effect.

8. The method according to claim 1, wherein a parameter of the predetermined function filter is fitted in advance so as to reflect a mask layout production dispersion.

9. The method according to claim 1, wherein the predetermined function filter includes an upper peak hold filter, such that when a curve of a function is traced using the upper peak hold filter, if a value on the curve of the function is larger than a previous maximum value, the value on the curve becomes a filter value, and if the value on the curve of the function is smaller than the previous maximum value, the previous maximum value is maintained as the filter value.

10. The method according to claim 1, wherein the predetermined function filter includes a Gauss function filter.

11. A photomask manufacturing method comprising producing a photomask based on a lithography simulation result obtained by a lithography simulation method for a semiconductor device, the lithography simulation method comprising:
    generating data of a mask transmission function from a mask layout, the mask transmission function representing a light transmission property of the mask layout;
    creating an optical image of the mask layout, which has passed through an optical system, by using the data of the mask transmission function, wherein the optical image is an intensity distribution from the optical system;
    generating data of a filtered function which is obtained by performing an operation for data of a predetermined function filter and the data of the mask transmission function, wherein performing an operation for data of a predetermined function filter and the data of the mask transmission function includes multiplying the mask transmission function by the predetermined function filter; and
    correcting the optical image by using the data of the filtered function.

12. A semiconductor device manufacturing method comprising:
    preparing a photomask based on a lithography simulation result obtained by a lithography simulation method for a semiconductor device; and
    transferring a pattern formed on the photomask to a photoresist on a semiconductor wafer, the lithography simulation method comprising:

generating data of a mask transmission function from a mask layout, the mask transmission function representing a light transmission property of the mask layout;

creating an optical image of the mask layout, which has passed through an optical system, by using the data of the mask transmission function, wherein the optical image is an intensity distribution from the optical system;

generating data of a filtered function which is obtained by performing an operation for data of a predetermined function filter and the data of the mask transmission function, wherein performing an operation for data of a predetermined function filter and the data of the mask transmission function includes multiplying the mask transmission function by the predetermined function filter; and correcting the optical image by using the data of the filtered function.

13. A computer-readable medium configured to store program instructions for execution on a computer, the program instructions being used for a lithography simulation for a semiconductor device and causing the computer to perform:

generating data of a mask transmission function from a mask layout, the mask transmission function representing a light transmission property of the mask layout;

creating an optical image of the mask layout, which has passed through an optical system, by using the data of the mask transmission function, wherein the optical image is an intensity distribution from the optical system;

generating data of a filtered function which is obtained by performing an operation for data of a predetermined function filter and the data of the mask transmission function, wherein performing an operation for data of a predetermined function filter and the data of the mask transmission function includes multiplying the mask transmission function by the predetermined function filter; and correcting the optical image by using the data of the filtered function.

* * * * *